(12) United States Patent
Lee et al.

(10) Patent No.: US 9,435,030 B2
(45) Date of Patent: Sep. 6, 2016

(54) RADICAL REACTOR WITH INVERTED ORIENTATION

(71) Applicant: VEECO ALD INC., Fremont, CA (US)

(72) Inventors: Daniel Ho Lee, Burlingame, CA (US); Samuel S. Pak, San Ramon, CA (US); Hyoseok Yang, Sunnyvale, CA (US); Sang In Lee, Los Altos Hills, CA (US)

(73) Assignee: Veeco ALD Inc., Fremont, CA (US)

( * ) Notice: Subject to any disclaimer, the term of this patent is extended or adjusted under 35 U.S.C. 154(b) by 0 days.

(21) Appl. No.: 14/398,898

(22) PCT Filed: Apr. 29, 2013

(86) PCT No.: PCT/US2013/038624
§ 371 (c)(1),
(2) Date: Nov. 4, 2014

(87) PCT Pub. No.: WO2013/165889
PCT Pub. Date: Nov. 7, 2013

(65) Prior Publication Data
US 2015/0125627 A1    May 7, 2015

Related U.S. Application Data

(60) Provisional application No. 61/643,159, filed on May 4, 2012.

(51) Int. Cl.
*C23C 16/50* (2006.01)
*C23C 16/452* (2006.01)
*C23C 16/458* (2006.01)
*C23C 16/448* (2006.01)
*H01J 37/32* (2006.01)

(52) U.S. Cl.
CPC ............ *C23C 16/50* (2013.01); *C23C 16/4488* (2013.01); *C23C 16/452* (2013.01); *C23C 16/4583* (2013.01); *H01J 37/3244* (2013.01); *H01J 37/32458* (2013.01); *H01J 37/32568* (2013.01)

(58) Field of Classification Search
None
See application file for complete search history.

(56) References Cited

U.S. PATENT DOCUMENTS 4,735,633 A    4/1988    Chiu
2010/0215871 A1    8/2010    Lee

OTHER PUBLICATIONS

PCT International Search Report and Written Opinion, PCT/US2013/038624, Sep. 13, 2013, 10 Pages.

*Primary Examiner* — Joseph Miller, Jr.
(74) *Attorney, Agent, or Firm* — Fenwick & West LLP

(57) ABSTRACT

A radical reactor including an elongated structure received within a chamber of a body of the radical reactor. Radicals are generated within a radical chamber formed in the elongated structure by applying a voltage signal across the elongated structure and an electrode extending within the radical chamber. The radicals generated in the radical chamber are routed via a discharge port of the elongated structure and a conduit formed in the body of the radical reactor onto the substrate. The discharge port and the conduit are not aligned so that irradiation generated in the radical chamber is not directed to the substrate.

16 Claims, 4 Drawing Sheets

RADICAL REACTOR WITH INVERTED ORIENTATION

BACKGROUND

1. Field of Art

The present disclosure relates to a radical reactor with a discharge port and a conduit configured in a way to prevent irradiation generated from a plasma chamber from reaching a substrate.

2. Description of the Related Art

Plasma is partially ionized gas consisting of large concentrations of excited atomic, molecular, ionic, and free-radical species. The radicals generated by plasma can be used for various purposes, including (i) chemically or physically modifying the characteristics of a surface of a substrate by exposing the surface to the reactive species or radicals, (ii) performing chemical vapor deposition (CVD) by causing reaction of the reactive species or radicals and source precursor in a vacuum chamber, and (iii) performing atomic layer deposition (ALD) by exposing a substrate adsorbed with source precursor molecules to the reactive species or radicals.

There are two types of plasma reactors: (i) a direct plasma reactor, and (ii) a remote plasma reactor. The direct plasma reactor generates plasma that comes into contact directly with the substrate. The direct plasma reactor may generate energetic particles (e.g., free radicals, electrons and ions) and radiation that directly contact the substrate. Such contact may cause damage to the surface of the substrate and also disassociate source precursor molecules adsorbed in the substrate. Hence, the direct plasma reactor has limited use in fabrication of semiconductor devices or organic light emitting diode (OLED) devices.

A remote plasma device generates plasma at a location remote from the substrate. When generating the plasma, other undesirable irradiation of electrons, ultraviolet ray or ions may also result from the plasma. The substrate may be exposed to such irradiation and cause damage to the substrate or make undesirable changes to the properties of the substrate.

SUMMARY

Embodiments related to a radical reactor for injecting radicals to a substrate. The body of the radical reactor is formed with a cavity extending across the body and a conduit from the cavity to a surface of the body facing a substrate passing across the radical reactor. The radical reactor includes an elongated structure contained in the cavity. The elongated structure formed with a radical chamber for receiving gas through a passage in the elongated structure and generating radicals by disassociating the received gas. The radicals are discharged from the elongated structure into the cavity via a discharge port not aligned with the conduit of the body to prevent irradiation generated in the radical chamber from reaching the substrate.

In one embodiment, an electrode extends across a length of the elongated structure. A voltage signal applied across the elongated structure and the electrode to generate the radicals.

In one embodiment, the conduit is configured to discharge the radicals onto the substrate from a first side of the radical reactor, and the discharge port is formed in the elongated structure to open towards a second side of the radical reactor opposite to the first side of the radical reactor.

In one embodiment, the first side is a bottom of the radial reactor and the second side is a top of the radical reactor.

In one embodiment, paths from the discharge port to the conduit are provided at both sides of the elongated structure.

In one embodiment, the passage includes a channel extending lengthwise across the elongated structure and perforations connecting the channel and the radial chamber.

In one embodiment, the elongated structure is separate from and removable from the body.

In one embodiment, the elongated structure is integrated with the body.

DETAILED DESCRIPTION OF EMBODIMENTS

Figure 1:
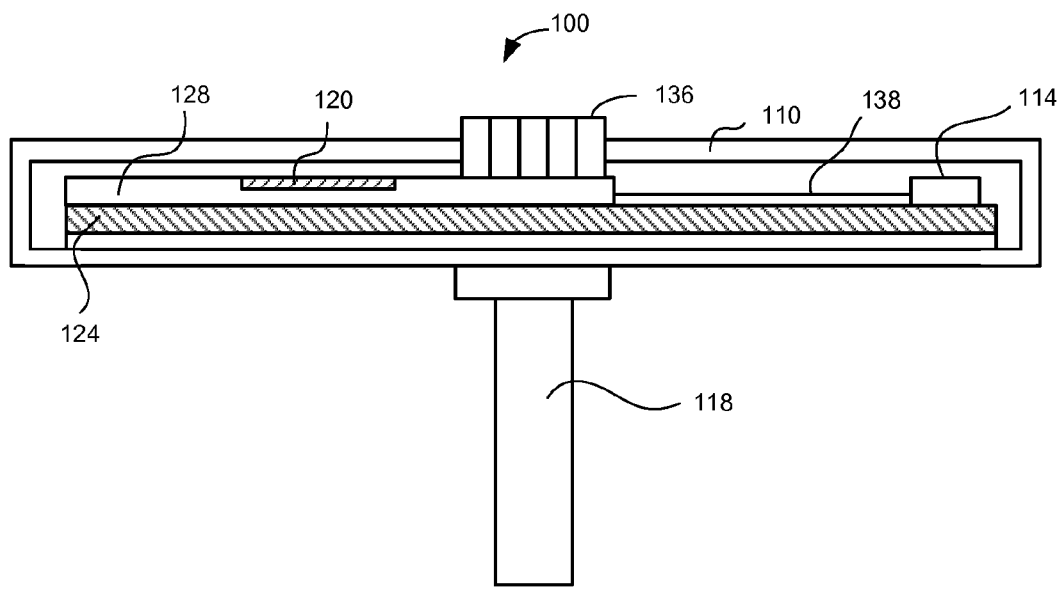
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to a radical reactor including an elongated structure received within a chamber formed in a body of the radical reactor. Radicals are generated within a radical chamber formed in the elongated structure by applying a voltage signal across the elongated structure and an electrode extending within the radical chamber. The radicals generated in the radical chamber are routed via a discharge port of the elongated structure and a conduit formed in the body of the radical reactor onto the substrate. The discharge port and the conduit are not aligned so that irradiation generated in the radical chamber is not directed to the substrate.

As used herein, when "A" and "B" are "aligned," it means that there is at least one straight path from "A" to "B".

Figure 2:
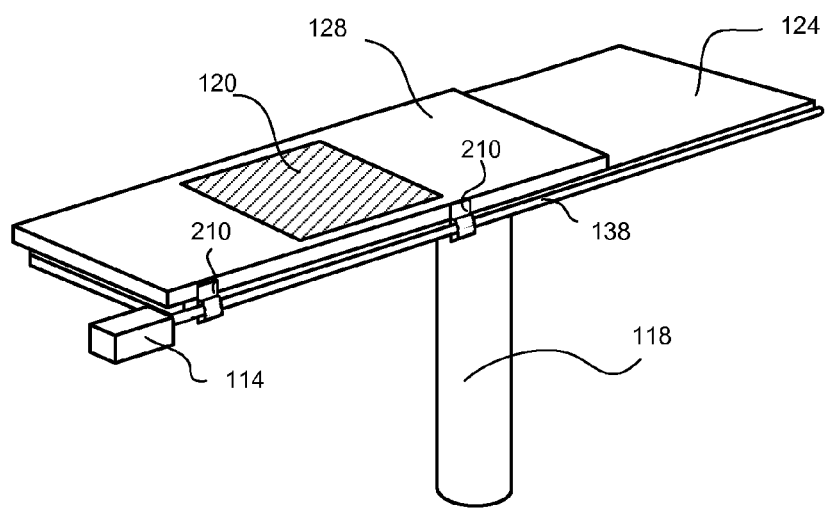
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and one or more reactors 136. The reactors 136 may include one or more of injectors and radical reactors. Each of the injectors injects source precursors, reactant precursors, purge gases or a combination of these materials onto the substrate 120. As described below in detail with reference to FIG. 5, source precursors and/or reactant precursors may be radicals of a gas mixture. Each of the radical reactors is a remote plasma reactor that generates radicals of gas supplied to the radical reactor, as described below in detail with reference to FIGS. 4A and 4B.

The process chamber enclosed by the walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins (not shown) that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and the direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3:
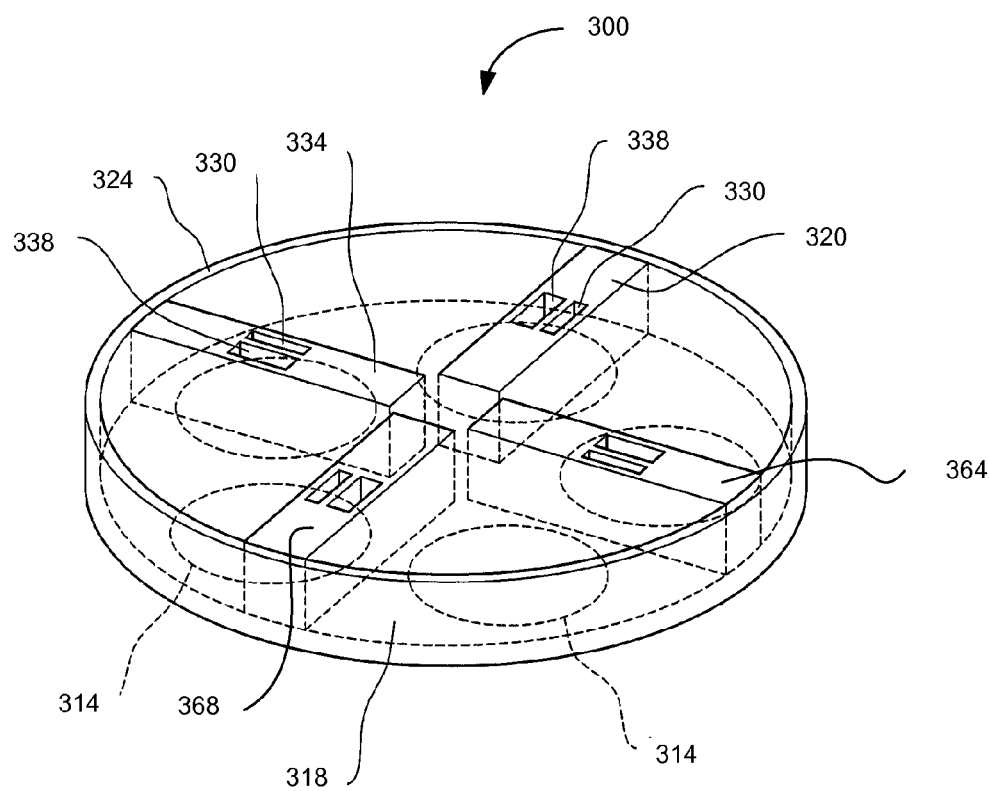
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320A, 320B, 334A, 334B, 364A, 364B, 368A, 368B, a susceptor 318, and a container 324 enclosing these components. A set of reactors (e.g., 320A and 320B) of the rotating deposition device 300 correspond to the reactors 136 of the linear deposition device 100, as described above with reference to FIG. 1. The susceptor 318 secures the substrates 314 in place. The reactors 320A, 320B, 334A, 334B, 364A, 364B, 368A, 368B are placed above the substrates 314 and the susceptor 318. Either the susceptor 318 or the reactors 320, 334, 364, 368 rotate to subject the substrates 314 to different processes.

One or more of the reactors 320A, 320B, 334A, 334B, 364A, 364A, 368B are connected to gas pipes (not shown) to provide source precursor, reactor precursor, purge gas and/or other materials. The materials provided by the gas pipes may be (i) injected onto the substrate 314 directly by the reactors 320A, 320B, 334A, 334B, 364A, 364B, 368A, 368B, (ii) after mixing in a chamber inside the reactors 320A, 320B, 334A, 334B, 364A, 364B, 368A, 368B, or (iii) after conversion into radicals by plasma generated within the reactors 320A, 320B, 334A, 334B, 364A, 364B, 368A, 368B. After the materials are injected onto the substrate 314, the redundant materials may be exhausted through outlets 330, 338. The interior of the rotating deposition device 300 may also be maintained in a vacuum state.

Figure 4A:
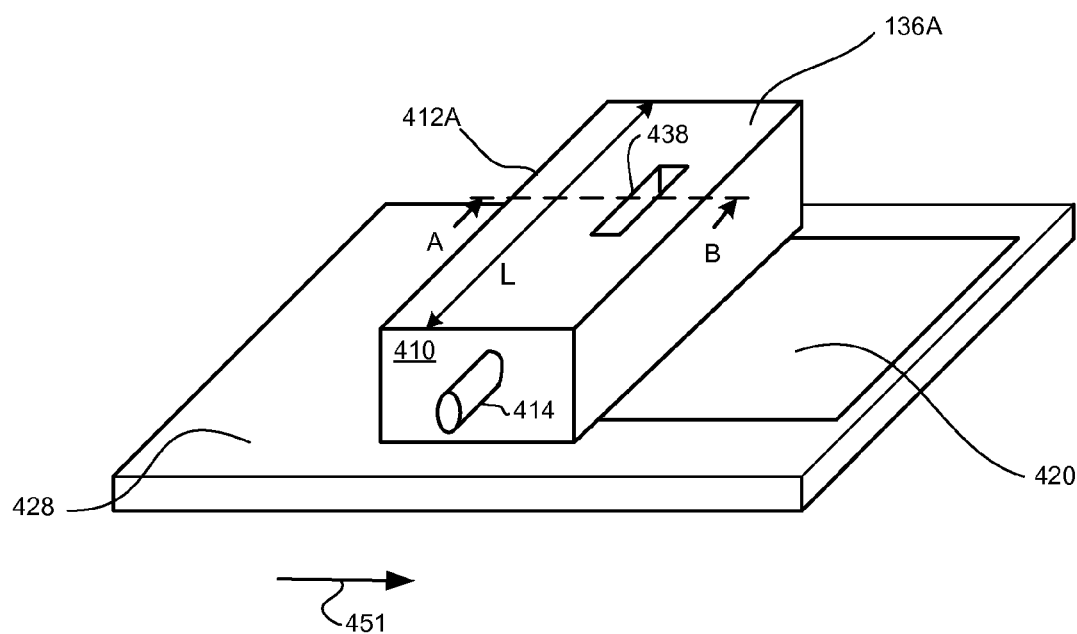
FIG. 4A is a perspective view of a radical reactor in a deposition device, according to one embodiment.

FIG. 4A is a perspective view of a radical reactor 136A, according to one embodiment. A substrate 420 is secured to a susceptor 428 that moves relative to the radical reactor 136A, as shown by arrow 451. The reactor 136A may be a radical reactor that generates radicals of gas or a gas mixture received from one or more sources. The gas or gas mixtures are injected into the reactor 136B via a pipe 414, and are converted into radicals within the reactor 136A by applying voltage across electrodes. The radicals are injected onto the substrate 420, and remaining radicals and/or gas reverted to an inactive state are discharged from the reactor 136A via exhaust port 438.

Figure 4B:
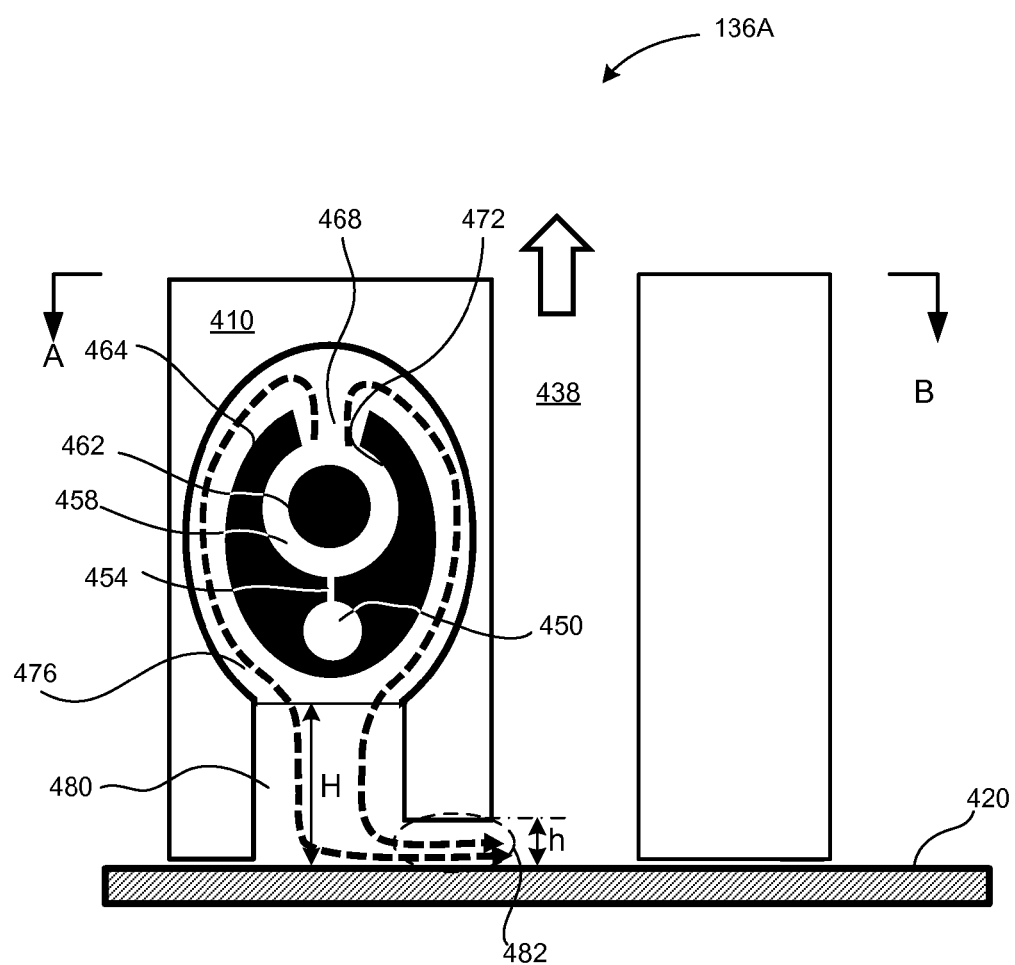
FIG. 4B is a cross-sectional view of the radical reactor of FIG. 4A, according to one embodiment.

FIG. 4B is a cross-sectional view of the radical reactor 136A taken along line A-B of FIG. 4A, according to one embodiment. The radical reactor 136A includes, among other components, a body 410, a middle bar 464, an electrode 462 extending lengthwise in the middle bar 464. The body 410 is formed with cavity 476 to house the middle bar 464. The cross-section of the cavity 476 is elliptic and the cavity 476 extends substantially across the length L of the radical reactor 136A. When the middle bar 464 is installed in the middle of the cavity 476, the cavity 476 provides two separate paths for radicals to travel to the substrate 420, one at the left side and the other at the right side of the middle bar 464 as shown by two dashed lines in FIG. 4B.

The middle bar 464 is an elongated structure formed with a channel 450 and perforations 454 (holes or slits) to convey the gas or gas mixtures received from the pipe 414 to a radical chamber 458. Radicals are generated in the radical chamber 458 by disassociating the conveyed gas or gas mixture. The disassociation may be performed by generating plasma in the radical chamber 458 or exposing the gas or gas mixtures to microwave.

In one embodiment, the radical chamber 458 is defined by the electrode 462 and the inner surface 472 of the middle bar 464 that functions as another electrode. A voltage signal is applied between the electrode 462 and the middle bar 464 to generate plasma in the radical chamber 458. When the gas or gas mixtures are provided to the radical chamber 458 while the voltage signal being applied to the electrodes, the plasma in the radical chamber 458 generates radicals. Since the plasma is generated away from the substrate 420, the radical reactor 136A is a type of remote plasma reactor.

The radicals flow into the cavity 476, a conduit 480, a constriction zone 482 and then into the exhaust port 438. The conduit 480 is formed in the body 410 of the radical reactor 136A and connects the cavity 476 to an area directly above the substrate 420.

A discharge port 468 is formed at a side of the middle bar 464 and configured so that at least part of the path from the discharge port 468 to the substrate 420 is not aligned. Hence, there is no straight path from the discharge port 468 to the substrate 420. In the example of FIG. 4B, a discharge port 468 is formed at the upper part of the middle bar 464 to discharge radicals generated in the radical chamber 458 into the cavity 476. The conduit 480 is formed at a bottom part of the cavity 476. Hence, the discharge port 468 is not aligned with the conduit 480. By having the discharge port 468 not aligned with the conduit 480, irradiation generated in the radical chamber 458 (e.g., ultraviolet light or electron beam) is blocked by the body 410 before reaching the substrate 420. Hence, the substrate 420 is not damaged or negatively influenced by such irradiation.

The generated radicals come into contact with the substrate 420 below the conduit 480. As the radicals travel from the discharge port 468 to the substrate 420 (as shown by dashed curve lines), some radicals may revert to gas in an inactive state. Such inactive gas is also discharged via the constriction zone 482 and the exhaust port 438.

The constriction zone 482 has height h that is lower than height H of the conduit 480. Hence, the gas while passing through the constriction zone causes Venturi effect. Venturi effect enables removal of any redundant material remaining on the substrate 420 after exposure to the radicals or from a previous process, and therefore, contributes to enhanced quality of layer formed on the substrate 420.

In other embodiments, the discharge port may be formed at a side of the middle bar 464 other than the bottom of the middle bar 464. In this way, the plasma generated in the radical chamber 458 is not irradiated onto the substrate 420, and hence, the substrate 420 is not damaged or negatively influenced by irradiation from the plasma.

In one embodiment, the middle bar 464 and the electrode 462 are modularized for removal and replacement. These components can be easily removed from the radical reactor 136A and replaced with new parts. In this way, the entire radical reactor 136A need not be replaced when these components are broken or not performing in a desired way.

In another embodiment, the middle bar 464 is integrated with and forms part of the body 410. In this embodiment, the middle bar 464 is not separable from the body 410.

Figure 5:
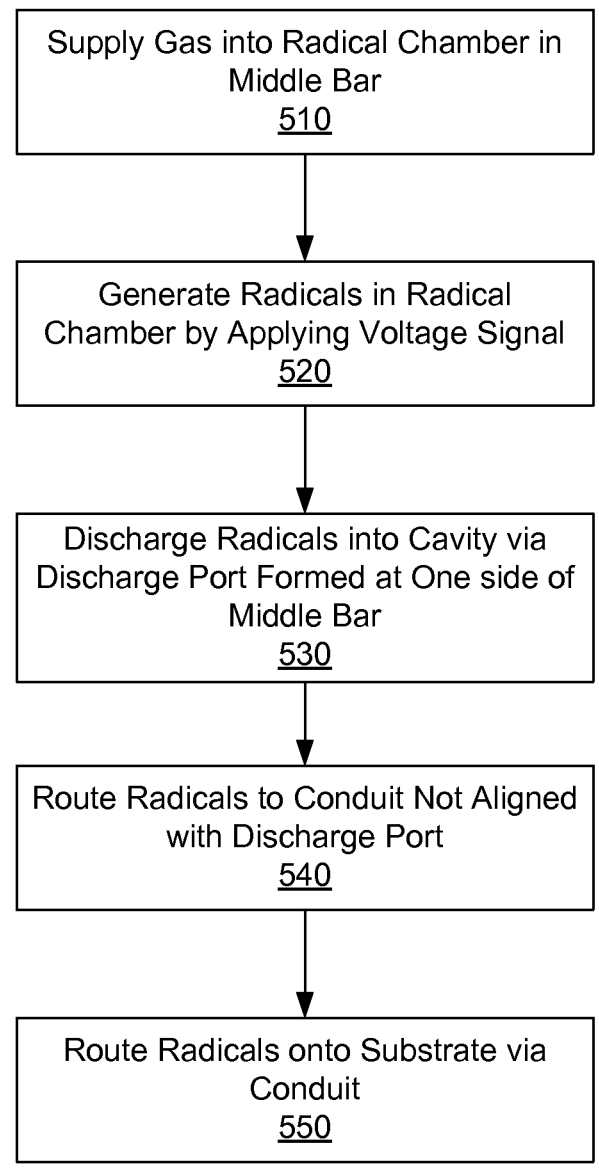
FIG. 5 is a flowchart illustrating a method of generating and injecting radicals onto the substrate, according to one embodiment.

FIG. 5 is a flowchart illustrating a method of generating and injecting radicals onto the substrate, according to one embodiment. First, gas is supplied 510 into the radical chamber 458 of the middle bar 464 placed in the cavity 476 of the body 410 of the radical reactor 136A. The radicals of the supplied gas is generated 520 in the radical chamber 458 by applying a voltage signal across the middle bar 464 and an electrode 462 extending across the radical chamber 458.

The generated radicals are discharged 530 into the cavity 476 via a discharge port 468 formed at one side of the middle bar 464. The radicals are routed 540 to the conduit 480 via the cavity 476. The conduit 480 is not aligned with the discharge port 468 to prevent irradiation generated in the radical chamber 458 from reaching and affecting the substrate 420. The radicals received in the conduit are routed 550 onto the substrate 420.

Although the present invention has been described above with respect to several embodiments, various modifications can be made within the scope of the present invention.

The invention claimed is:

1. A radical reactor for injecting radicals to a substrate, comprising:
   a body formed with a cavity extending across the body and a conduit from the cavity to a surface of the body facing a substrate passing across the radical reactor; and
   an elongated structure contained in the cavity, the elongated structure formed with a radical chamber for receiving gas through a passage in the elongated structure and generating radicals by disassociating the received gas,
   wherein the radicals are discharged from the elongated structure into the cavity via a discharge port not aligned with the conduit of the body to prevent irradiation generated in the radical chamber from reaching the substrate.

2. The radical reactor of claim 1, further comprising an electrode extending across a length of the elongated structure, a voltage signal applied across the elongated structure and the electrode to generate the radicals.

3. The radical reactor of claim 1, wherein the conduit is configured to discharge the radicals onto the substrate from a first side of the radical reactor, and the discharge port is formed in the elongated structure to open towards a second side of the radical reactor opposite to the first side of the radical reactor.

4. The radical reactor of claim 3, wherein the first side is a bottom of the radical reactor and the second side is a top of the radical reactor.

5. The radical reactor of claim 1, wherein paths from the discharge port to the conduit are provided at both sides of the elongated structure.

6. The radical reactor of claim 1, wherein the passage comprises a channel extending lengthwise across the elongated structure and perforations connecting the channel and the radical chamber.

7. The radical reactor of claim 1, wherein the elongated structure is separate and removable from the body.

8. The radical reactor of claim 1, wherein the elongated structure is integrated with the body.

9. A deposition apparatus comprising:
   an injector for injecting gas onto a substrate; and
   a radical reactor for injecting radicals onto the substrate, comprising:
      a body formed with a cavity extending across the body and a conduit from the cavity to a surface of the body facing a substrate passing across the radical reactor, and
      an elongated structure contained in the cavity, the elongated structure formed with a radical chamber for receiving gas through a passage in the elongated structure and generating radicals by disassociating the received gas,
      wherein the radicals are discharged from the elongated structure into the cavity via a discharge port not aligned with the conduit of the body.

10. The deposition apparatus of claim 9, wherein the radical reactor further comprises an electrode extending across a length of the elongated structure, a voltage signal applied across the elongated structure and the electrode to generate the radicals.

11. The deposition apparatus of claim 9, wherein the conduit is configured to discharge the radicals onto the substrate from a first side of the radical reactor, and the discharge port is formed in the elongated structure to open towards a second side of the radical reactor opposite to the first side of the radical reactor.

12. The deposition apparatus of claim 11, wherein the first side is a bottom of the radical reactor and the second side is a top of the radical reactor.

13. The deposition apparatus of claim 9, wherein paths from the discharge port to the conduit are provided at both sides of the elongated structure.

14. The deposition apparatus of claim 9, wherein the passage comprises a channel extending lengthwise across the elongated structure and perforations connecting the channel and the radical chamber.

15. The deposition apparatus of claim 9, wherein the elongated structure is separate from and removable from the body.

16. The deposition apparatus of claim 9, wherein the elongated structure is integrated with the body.

* * * * *